(12) United States Patent
Celaya Prieto et al.

(10) Patent No.: US 9,130,096 B2
(45) Date of Patent: Sep. 8, 2015

(54) HIGH-CONCENTRATION PHOTOVOLTAIC SOLAR MODULE

(75) Inventors: Fernando Celaya Prieto, Seville (ES); Antonio De Dios Pardo, Seville (ES); Carlos Martín Maroto, Seville (ES); Francisco David Peña Consuegra, Seville (ES)

(73) Assignee: Abengoa Solar New Technologies, S.A., Seville (ES)

( * ) Notice: Subject to any disclaimer, the term of this patent is extended or adjusted under 35 U.S.C. 154(b) by 547 days.

(21) Appl. No.: 13/498,060

(22) PCT Filed: Sep. 14, 2010

(86) PCT No.: PCT/ES2010/070595
§ 371 (c)(1),
(2), (4) Date: Jun. 1, 2012

(87) PCT Pub. No.: WO2011/036323
PCT Pub. Date: Mar. 31, 2011

(65) Prior Publication Data
US 2012/0240978 A1 Sep. 27, 2012

(30) Foreign Application Priority Data
Sep. 23, 2009 (ES) .................................. 200930720

(51) Int. Cl.
*H01L 31/054* (2014.01)
*H01L 31/052* (2014.01)
*H01L 31/05* (2014.01)

(52) U.S. Cl.
CPC .......... *H01L 31/052* (2013.01); *H01L 31/0508* (2013.01); *H01L 31/0543* (2014.12); *Y02E 10/52* (2013.01)

(58) Field of Classification Search
CPC . H01L 31/048; H01L 31/0522; H01L 31/024; H01L 31/18; H01L 2224/49175
USPC ............................................ 438/65, 244–265
See application file for complete search history.

(56) References Cited

U.S. PATENT DOCUMENTS 5,965,653 A * 10/1999 Nishikawa et al. ........... 524/424
6,399,874 B1 * 6/2002 Olah ............................ 136/259

(Continued)

FOREIGN PATENT DOCUMENTS

ES 2 229 950 4/2005
ES 2 267 382 3/2007

(Continued)

OTHER PUBLICATIONS

International Search Report for International Application No. PCT/ES2010/070595 mailed Dec. 15, 2010.

*Primary Examiner* — Jayne Mershon
(74) *Attorney, Agent, or Firm* — Merchant & Gould P.C.

(57) ABSTRACT

A high-concentration photovoltaic solar module is formed by a casing (1) that contains photovoltaic receivers (2) in the base (3) thereof, which are interconnected with one another, and in the upper part thereof has Fresnel concentrator lenses (7) in a plane parallel to that of the photovoltaic receivers (2), which close the casing in a leak-tight manner. Each of the Fresnel concentrator lenses (7) is arranged on one of the photovoltaic receivers (2). Furthermore, the module includes secondary optical elements (8), each arranged on the photovoltaic cell (5) of each photovoltaic receiver (2). The casing (1) is produced by injection-molding of plastic and incorporates cavities (9) in the base (3), each of the cavities housing a photovoltaic receiver (2), and metal laminar elements (10) for interconnecting the photovoltaic receivers (2).

18 Claims, 9 Drawing Sheets

(56) References Cited

U.S. PATENT DOCUMENTS

| | | | |
|---|---|---|---|
| 2007/0215198 A1 | 9/2007 | Jiang et al. | |
| 2008/0210290 A1 | 9/2008 | Wu et al. | |
| 2009/0107541 A1* | 4/2009 | Linke et al. | 136/246 |
| 2009/0159125 A1* | 6/2009 | Prather et al. | 136/259 |
| 2010/0065120 A1* | 3/2010 | McDonald | 136/259 |
| 2010/0307563 A1 | 12/2010 | Vilella | |
| 2011/0048497 A1* | 3/2011 | Okamoto et al. | 136/246 |

FOREIGN PATENT DOCUMENTS

| | | | |
|---|---|---|---|
| WO | WO 96/18213 | | 6/1996 |
| WO | WO 2006/070425 | | 7/2006 |
| WO | WO 2009/090843 | * | 7/2009 |

\* cited by examiner

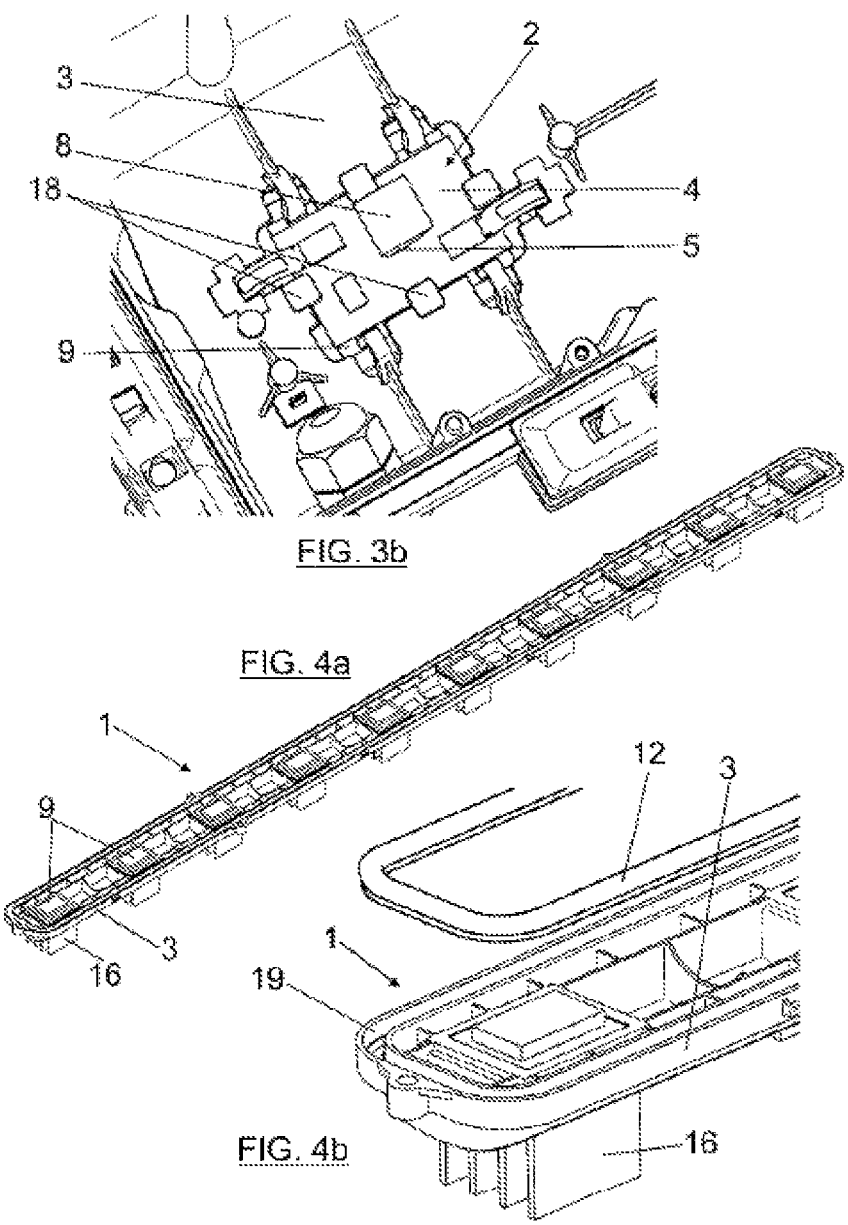

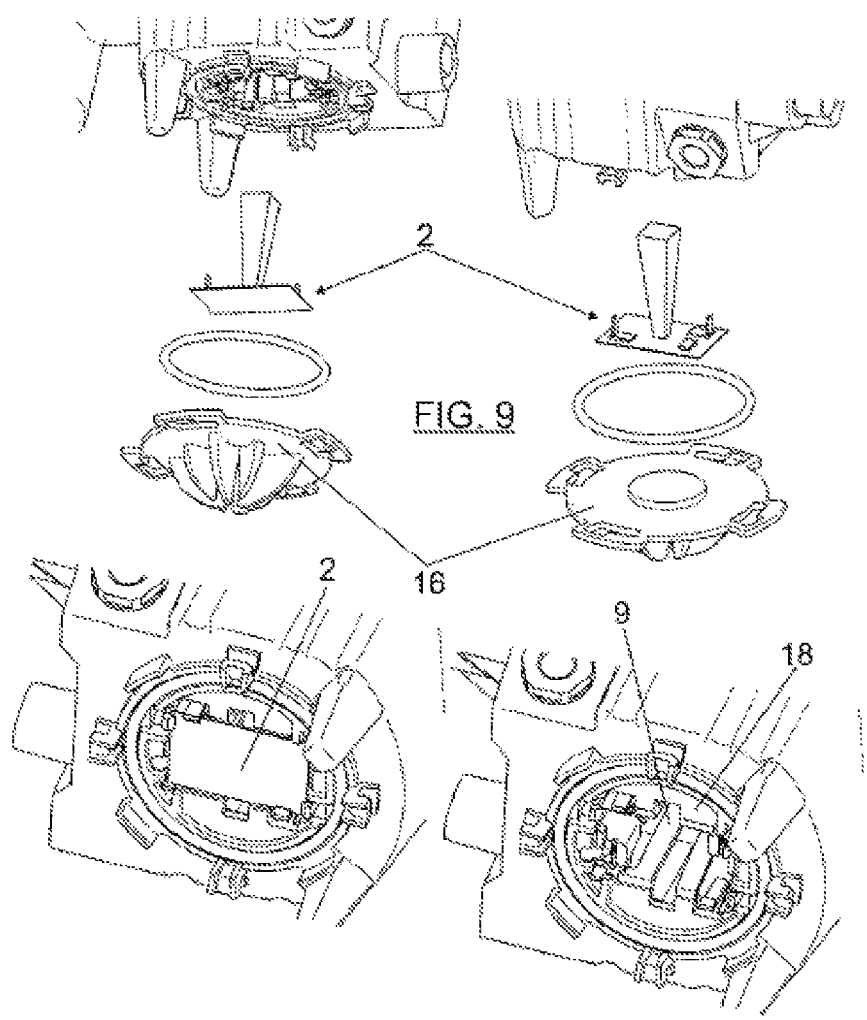

HIGH-CONCENTRATION PHOTOVOLTAIC SOLAR MODULE

This application is a National Stage Application of PCT/ES2010/070595, filed 14 Sep. 2010, which claims benefit of Serial No. P200930720, filed 23 Sep. 2009 in Spain and which applications are incorporated herein by reference. To the extent appropriate, a claim of priority is made to each of the above disclosed applications.

TECHNICAL FIELD OF THE INVENTION

The present invention belongs to the technical field of photovoltaic solar modules for harnessing solar energy for producing electrical energy, specifically high-concentration photovoltaic solar modules, and more specifically modules formed by an array of Fresnel concentrator lenses, a secondary optical system, and high-efficiency photovoltaic cells.

BACKGROUND OF THE INVENTION

Today, solar energy is frequently considered as a renewable alternative to the energy generated by fossil fuel which is predominantly used today. Cost is a major factor in determining the type of energy source to be used, and it can reasonably be expected that when the energy created through the conversion of solar power is cost-competitive with that generated by fossil fuels, the use of solar energy will be more widespread.

Solar energy conversion modules converting sunlight into electrical energy typically use photovoltaic cells which directly convert solar energy into electrical energy. Photovoltaic solar cells are devices capable of transforming solar radiation into electricity in a direct manner. The amount of energy created by the cell is directly related with the amount of solar energy absorbed by the cell, and the amount of energy absorbed by the cell is a function of both the size and surface area of the cell and of the intensity of sunlight and wavelength striking it.

High-concentration photovoltaics (HCPV) is a new technology that is beginning to be a low-cost alternative for generating electricity.

The high cost of manufacturing photovoltaic modules, mainly the cost of cells, which are for the most part imported from other countries, mean that sale prices are excessively high.

In relative terms, the photovoltaic cell is the most expensive component of a solar energy converter. Therefore, the increase in the electrical production of the converter by increasing the surface area of the cells can be very expensive, and other methods are normally used to increase the intensity of sunlight striking the cell. Such methods include using concentrator lenses and/or mirrors for focusing the sunlight on the cell.

The size of the module also affects the cost in other less direct manners. Since most solar energy converters are manufactured far from their installation site, transport and final assembly costs can be considerable. Transport costs can obviously be greatly reduced by reducing the size of the module converter, and simplification of the general structure can be expected to reasonably reduce assembly costs and the cost of the solar collector itself.

In fact, to install a megawatt-peak of conventional photovoltaic modules in a semiconductor material, a space equivalent to the surface of a football field, i.e., approximately 8000 $m^2$, is required. In contrast, in the case of high-concentration photovoltaics, the necessary semiconductor surface is reduced to eight square meters, which demonstrates the economic advantages of this technology, because the use of space for installations of high-concentration solar module farms or panels is much less.

With respect to the foregoing, it should be pointed out that conventional photovoltaic cells are manufactured with silicon, in contrast those used in high concentration are made with elements from groups III-V of the periodic table system, elements such as gallium, indium, phosphorus and others of the same type, usually on germanium substrates, forming multijunction tandem cells which allow using the solar spectrum much more efficiently.

In the case of silicon cells, since they are single-junction cells, the theoretical conversion limit, determined by their efficiency, is about 40% in concentration conditions. In contrast, for multijunction cells, the theoretical limit is 86.4%, so the improvement potential is very high.

Commercial silicon cells today have maximum efficiencies of twenty-one percent (21%) (monocrystalline silicon) for one sun, whereas triple-junction cells have efficiencies of about 37%.

Actually, most conventional silicon photovoltaic installations have efficiencies of less than 15%. Accordingly, the total photovoltaic solar capture surface can be drastically reduced by means of using high concentration photovoltaics (almost half that today, i.e., 50% of the surface required by conventional photovoltaics, and with the potential to even reduce this percentage). This reduction of total surface area required for installed equivalent peak power by means of using high-concentration photovoltaics technology allows reducing the cost of important elements of the installations, such as a lower amount of necessary terrain, a lower number of solar trackers, reduction of wiring distances and other structural elements, and reduction of transport costs as a result of the decrease in volume and weight of the required elements.

As a result of the foregoing, the cost per installed Watt has a huge reduction impact.

In some countries, such as Spain, greater priority is given to indoor electrical energy-generating photovoltaic installations than in solar plants, so technological advances must be aimed at said location.

A related object is to provide a solar energy converter of this type using an individual optical lens or concentrator complemented with a secondary optical element for each cell.

The system of applying solar radiation concentrator lenses on photovoltaic cells to increase the electrical energy production capacity thereof consists of using a concentrator lens made from glass, methacrylate, polyurethane, polyethylene, polypropylene or any other type of material of a similar class, which is transparent to allow the passage of solar rays. In this case, Fresnel lenses have the property of being high-powered solar radiation concentrator elements, and accordingly allow harnessing said energy in the field of energy photovoltaics.

Circular concentric grooves are engraved on said lens along the entire diameter of the lens, this being the element giving the lens its solar radiation concentration power. In summary, it is a conventional solar radiation concentrator lens the dimensions of which are usually between 10 to 30 centimeters in diameter, said measurements being able to vary according to the needs for which it is to be used.

The lens is located on a support or frame having a smaller double bottom to place the photovoltaic cell therein, located between 10 to 30 centimeters spaced from the concentrator lens. Once the assembly is oriented towards the position of the sun, the rays strike the lens, passing through it, until reaching the photovoltaic cell which receives said solar radiation increased in power due to the effect of a larger radiation surface upon its passage through the concentrator lens and the additional secondary optical element.

The units thus arranged, i.e., the assembly of a concentrator lens, superimposed on a photovoltaic cell at a distance of between 10 to 30 centimeters, and both elements supported on a box, casing or frame, can be placed in series to form the photovoltaic modules, and in the necessary number to reach the wattage that is to be determined in each module, taking into account the energy production capacity of each cell according to the higher performance obtained by the concentrator lens efficacy.

In addition, it is important to stress that unlike other technologies already tested in installations for many years, high concentration photovoltaics are not yet used in plants operating for a prolonged time. It is therefore fundamental to make devices which offer long-term reliability assurances.

Most high-concentration photovoltaic modules known on the market are closed-type modules, as shown in patent ES2229950, where a surrounding structure or casing having lenses on its upper outer surface contains active elements, such as cells, protection diode, and the necessary wiring.

The aforementioned elements of the modules are very sensitive to humidity and contact with it causes accelerated degradation which can limit its useful life under acceptable operating conditions. Even though systems are incorporated for encapsulating these elements, it is very important for the receptor to be sealed and to prevent the entrance of humidity or other external elements to prevent these effects.

Modules existing on the market have not fulfilled the necessary leak-tightness in a satisfactory manner, as is the case of patent ES2267382, the structure of which in addition to not assuring leak-tightness because it is formed by a central U-shaped sector and to side fins fixed by fixing means such as resins, in the event that a part therein should break or malfunction, it is necessary to break the module to access it. Likewise, a factor to take into account is the problem of relative humidity generated inside the module, having direct consequences on the active elements of the system.

In addition, the closures of current modules require using adhesive materials which prevent or complicate replacing lenses or other elements of the module.

Furthermore, high structural rigidity allowing the structure to perform suitably against the stresses it will have to withstand in the service life of the installation, which is about 25 years, is required for the system. The system will be exposed to the elements, withstanding extreme climate conditions. An international standard, IEC 62108, has been defined to simulate the behavior of the system, and compliance with this standard is mandatory for any high-concentration photovoltaic product that will be part of this market. This standard requires performing a series of tests that allow simulating the expected field behavior of the system.

A system providing high-concentration photovoltaics, preventing the drawbacks existing in earlier systems of the state of the art, is therefore desirable.

SUMMARY OF THE INVENTION

The present invention solves the problems existing in the state of the art by means of a high-concentration photovoltaic solar module formed by a casing that contains photovoltaic receivers fixed to the base thereof interconnected with one another and which can preferably be detachable from the base of said casing. Each of the photovoltaic receivers includes a receiver surface on which there is arranged at least one photovoltaic cell, a protection diode, and the respective connectors of the photovoltaic receiver.

The module furthermore has a plurality of Fresnel concentrator lenses which are arranged in the upper part of the casing, in a plane parallel to that of the photovoltaic receivers, and close the casing in a leak-tight manner. The number of Fresnel concentrator lenses is equal to the number of photovoltaic receivers, and each of the lenses is arranged on one of said photovoltaic receivers.

The photovoltaic module additionally has secondary optical elements, each arranged on the photovoltaic cell of each photovoltaic receiver.

These secondary optical elements preferably have an inverted truncated pyramid shape.

The shape of the casing of the module of the invention allows there to be less internal air as it has a smaller space because the inner air, subjected to climate weather conditions for a prolonged time, can become condensed, generating humidity therein. The module could further be compatible with the installation of a dehumidification system which allows maintaining the relative humidity inside the module at very low levels, minimizing the effects that humidity can have on the active elements of the system. The casing also allows placing Fresnel lenses in the front and forming a row to constitute the desired array of lenses.

The present invention relates to a module with a new system of applying solar radiation concentrator lenses on photovoltaic cells to increase the electrical energy production capacity thereof. This is achieved due to the higher intensity of solar radiation received by the photovoltaic cell by placing between it and the solar rays a concentrator lens having a larger surface than the cell, and a secondary element in turn acting as a concentrator, flow homogenizer and chromatic mixer capable of increasing the radiation potential projected onto the photovoltaic cell, improving the acceptance angle and accordingly increasing the electrical energy production capacity of said photovoltaic cell.

The casing of the photovoltaic module object of the present invention is produced by injection-molding of plastic and incorporates a plurality of cavities in the base thereof, each of these cavities for housing a photovoltaic receiver, and a plurality of metal laminar elements necessary for interconnecting the photovoltaic receivers.

The leak-tight closure allows insulating the components of the module from the elements, preventing the entrance of water, dust or other elements therein which could degrade the operation thereof, thus assuring durations of the solar module exceeding 25 years.

To close the module in the upper part thereof, the Fresnel concentrator lenses are supported on a perimetral flange of the upper part of the casing, and this closure can be done in two different ways. According to a particular embodiment, the Fresnel concentrator lenses close against the casing by means of plastic closure elements distributed along the perimetral flange of the upper part of the casing, and said elements can be detached from the latter. An upper gasket can be placed between the plurality of Fresnel concentrator lenses and the casing to improve the leak-tightness of the closure. According to an alternative embodiment, the Fresnel concentrator lenses close against the casing by means of overmolding said lenses on the casing, so no additional closure element would be necessary.

These leak-tight closures of the present solar module allow an IP65 which is an index according to International Standard IEC 60529 indicating the level of protection of the system against the intrusion of solid objects, dust, accidental contact or water. In this case, the two digits of the IP65 index indicate that the module of the invention does not allow penetration of dust, maintains integrity of the inner electrical contacts and does not allow the entrance of water even with a strong jet in any direction and, in the case of closure by means of closure elements, it allows it to be completely detachable.

The arrangement of the Fresnel lenses, concentrator of the solar radiation enhancement on the assembly of photovoltaic cells of the receivers located in the module, therefore further serves as a cover of the module where the cells are located, thus maintaining the concentration of heat accumulated inside the module. In other words, the concentrator lens performs the dual function of enhancing solar radiation and that of serving as protection of the cells for making better use of the temperature.

The present photovoltaic solar module is based on the basic operating principle of photovoltaic cells which generate electrical energy when receiving solar radiation intensity. Therefore, by placing a solar radiation concentrator lens with a larger surface in front of the photovoltaic cell, the solar energy power on the photovoltaic cell is increased, thereby achieving greater radiation and, accordingly, greater electrical energy production by said cell. Said position must be very precisely calculated to assure perfect alignment of the center of the Fresnel lens with its respective photovoltaic receiver. Therefore, the casing of the module of the present invention has pre-fixed cavities assuring positioning of the photovoltaic receivers in their most optimal position during the manufacturing and assembly process.

Furthermore, the casing preferably has plastic fastening parts integrated therein for fastening each of the secondary optical elements.

All this entails a very considerable saving in material used in the construction of photovoltaic modules because the number of photovoltaic cells to be used, which is essentially the fundamental factor in the increase in their cost price, is considerably reduced.

These considerations entail an important advance in the implementation of solar energy for use in electrical energy production systems since it can be obtained at a much lower cost compared with other energy generation systems by means of conventional photovoltaic systems.

The present module is formed by high-efficiency photovoltaic cells made with the multijunction of elements from groups III-V. The photovoltaic cells have a reduced size and sunlight strikes them through special Fresnel-type lenses, which allows operating at very high concentration ratios (above 400 suns).

By means of using the elements described above it is possible to obtain efficiencies above 24%, making this technology an important candidate for accessing high-volume photovoltaic market niches because it allows generating electricity more economically than other technologies.

Specifically, each solar module object of the invention proves between 35 watts of power with an ambient temperature of 25° C., although the system is basically scalable, so considerably lower or greater power modules could be conceived based on the same principles.

According to a preferred embodiment of the photovoltaic solar module object of the present invention, said module has protection means against defocusing formed in turn by a protection plate for the casing for each of the photovoltaic receivers which is placed between the concentrator lens and the photovoltaic receiver. This protection plate has an opening through which the concentrated sunlight solely and exclusively reaches the secondary optical element, thereby preventing damage to the plastic casing in the area around the photovoltaic receivers due to the incidence of the sunlight.

The module preferably has heat sinks to eliminate the heat accumulated by the incidence of solar radiation. According to a particular embodiment, these sinks are arranged on the outer face of the base of the casing, each in correspondence with a photovoltaic receiver, and dissipate the heat given off by each photovoltaic receiver and are furthermore detachable, acting as an element for opening and closing the casing at the base thereof. According to an alternative embodiment, all the sinks are integrated in a detachable lower cover which groups them together and acts as a single element for opening and closing the casing at the base thereof.

This dissipation system is suitable for a high concentration (of the order of 400 to 500 soles, though scalable to concentration ratios exceeding 800 suns) on multijunction photovoltaic cells of less than a square centimeter. The dissipation system is at the same time economical and efficient, so the cost reduction introduced by the photovoltaic element surface reduction is not negatively compensated by the additional cost of the dissipation system.

BRIEF DESCRIPTION OF THE DRAWINGS

To aid in understanding the invention, an embodiment of the invention will be described below in an illustrative but non-limiting manner in reference to a series of figures.

FIG. 1 shows a side view of two different embodiments of the high-concentration photovoltaic module object of the present invention.

FIG. 3b shows an upper plan view of the lower area of the module of FIG. 1a, where the photovoltaic receiver can be seen.

FIG. 4a shows a general view of the lower part of the casing of the module of FIG. 1a, where 10 cavities where the receivers contact can be seen by way of example and which, in turn, by means of the metal structure of fins formed by extrusion perform the function of heat dissipation. FIG. 4b shows a detail of this lower part of the casing, where a gasket can be observed.

FIG. 9 shows different views of a particular embodiment of the sinks of the module of FIG. 1b.

Figure 1A:
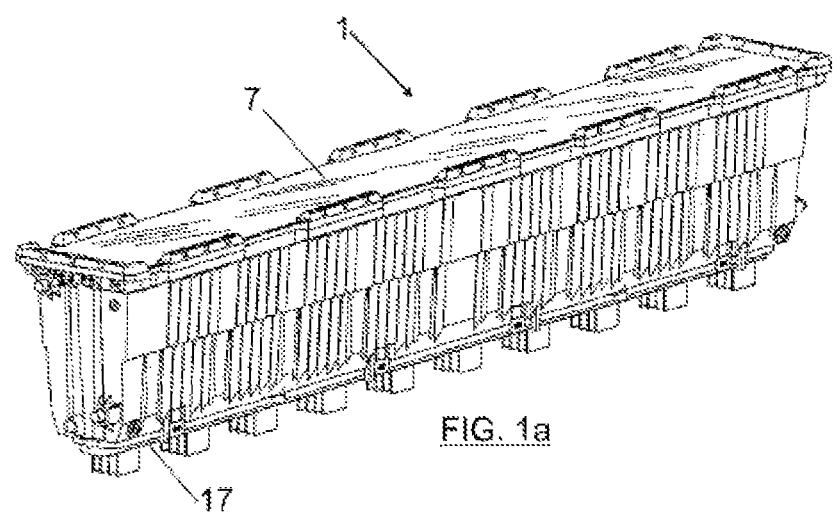
FIG. 1a shows a module with a lower cover integrating the sinks and support and contact bases with the photovoltaic receivers.
Figure 1B:
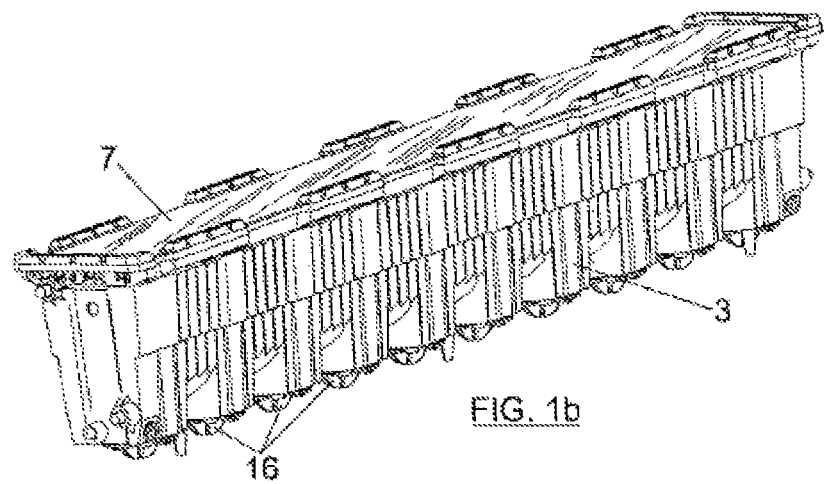
FIG. 1b shows a module without the lower cover in which the sinks in contact with the receiver are seen.

The following set of elements is referred to in the figures:
1. casing of the photovoltaic solar module
2. photovoltaic receivers
3. base of the casing
4. receiver surface
5. photovoltaic cell
6. protection diode
7. Fresnel concentrator lenses
8. secondary optical elements
9. cavities for housing the photovoltaic receivers
10. metal laminar elements for interconnecting the receivers
11. plastic closure elements
12. upper gasket
13. plastic fastening parts
14. protection plate for the casing
15. opening of the protection plate for the casing
16. heat sinks
17. lower cover
18. fixing tabs for the photovoltaic receivers
19. perimetral flange of the upper part of the casing

DETAILED DESCRIPTION OF THE INVENTION

Figure 6:
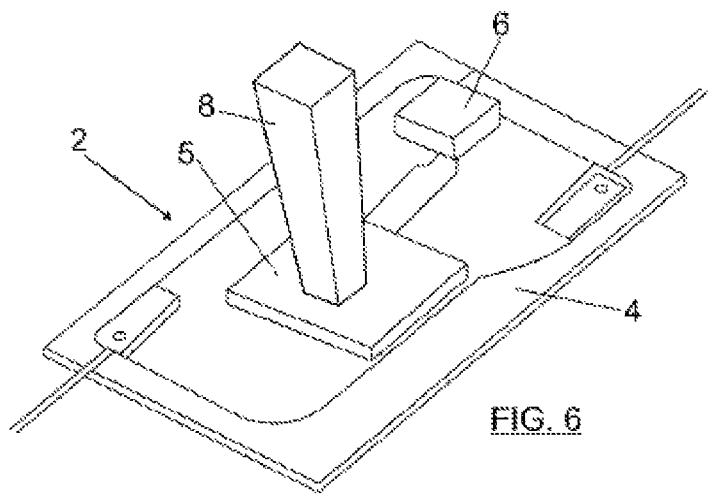
FIG. 6 shows a photovoltaic receiver with all the elements forming part of said receiver.

As can be seen in the figures, the object of the present invention is a high-concentration photovoltaic solar module formed by a casing 1 that contains photovoltaic receivers 2 located in the base 3 thereof and which are interconnected with one another. Each of the photovoltaic receivers 2 has a receiver surface 4, which is preferably made from ceramic or metal alloy, on which there is arranged at least one photovoltaic cell 5, a protection diode 6, and the respective connectors of the photovoltaic receiver 2. FIG. 6 shows in detail the essential components of the photovoltaic receiver 2.

Additionally, as can be seen in FIGS. 1a, 1b, 5a, 5b and 11, the solar module object of the invention has Fresnel concentrator lenses 7 acting as the primary optical element and located in the upper part of the casing 1, closing it in a leak-tight manner, in a plane parallel to that of the photovoltaic receivers 2. The Fresnel concentrator lenses 7 are equal in number to the photovoltaic receivers 2, and each is arranged on one of said photovoltaic receivers 2. The array of Fresnel concentrator lenses 7 is formed by laminating a polymer material with the grooves defining the lens on glass.

Figure 10A:
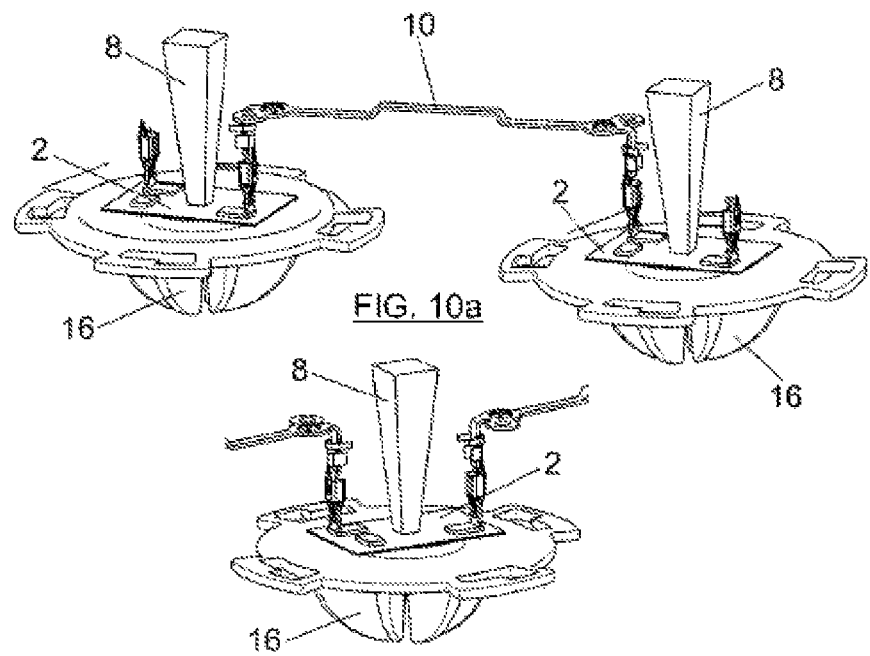
FIG. 10a shows different views of the interconnection between the photovoltaic receivers.
Figure 10B:
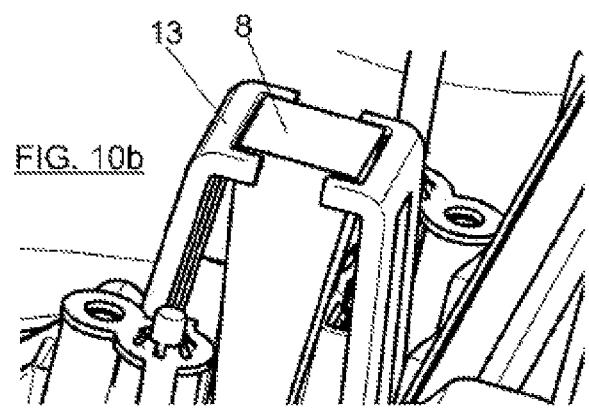
FIG. 10b shows the fastening part of the secondary optical element.
Figure 11:
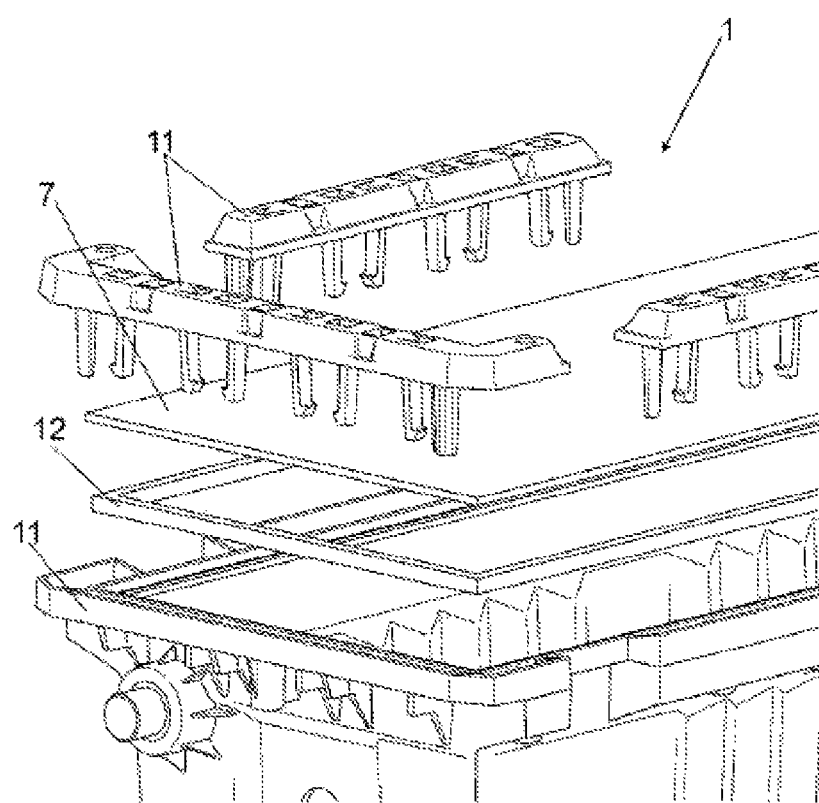
FIG. 11 shows the closure of the Fresnel lenses against the casing by means of plastic closure elements and a gasket.

Finally, the solar module has a secondary optical element 8 arranged on the photovoltaic cell 5 of each of the photovoltaic receivers 2, as can be seen in FIGS. 6 and 10b, which allow an increase in the degree of concentration of sunlight. The existence of a primary optical element 7 and a secondary optical element 8 improves the acceptance angle of light and the concentration, and confers uniform illumination of the cell, thus improving the energy efficiency of the photovoltaic cell.

The casing 1 of the solar module is produced by injection-molding of plastic, preferably glass fiber-reinforced PET, or a polymer material of similar features manufactured as a sealed structure. The shape of the plastic casing 1 prevents condensation inside the module, as occurs in modules existing in the state of the art, in which the inner air, subjected to climate weather conditions for a prolonged time, can become condensed, generating humidity therein. The solar module object of the present invention can further be compatible with the installation of a dehumidification system such that it allows maintaining the relative humidity inside the module at very low levels, minimizing the effects that humidity can have on the active elements of the system.

Figure 3A:
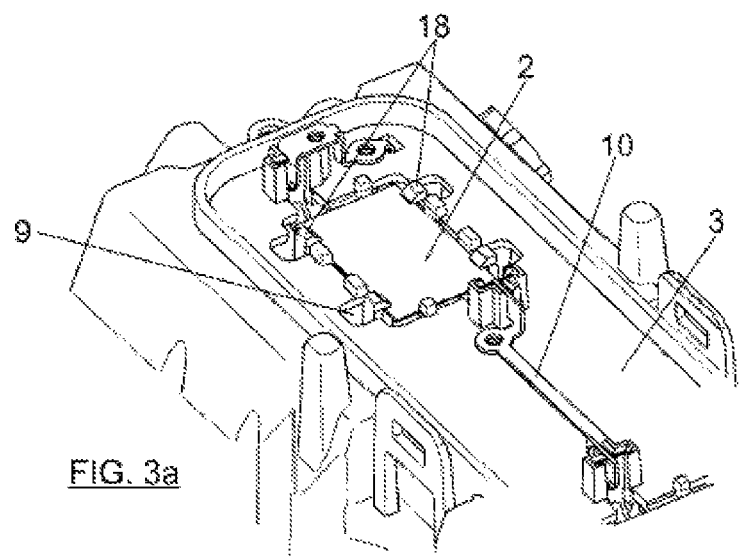
FIG. 3a shows a lower plan view of the lower area of the module of FIG. 1a, with the lower cover removed, where the fixing of the photovoltaic receiver from below using plastic tabs included in the casing can be observed and, the metal laminar elements serving to connect the receivers in series inside the module can also be observed.
Figure 5A:
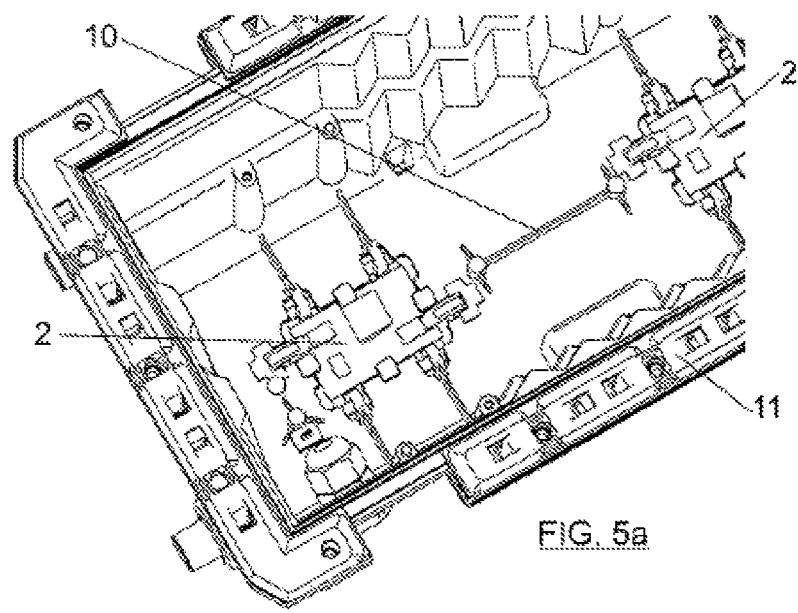
FIG. 5a shows a top view of the module of FIG. 1a where the interconnected receivers in the base of the casing can be seen.
Figure 5B:
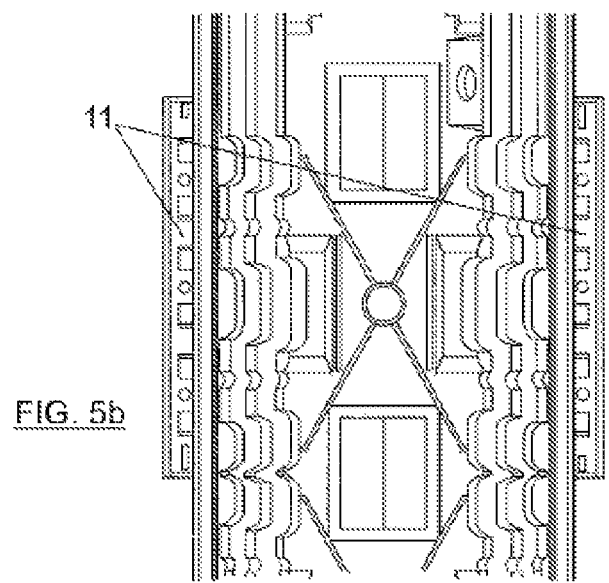
FIG. 5b shows the arrays of lenses assembled for placement on the casing. The figures also show the type of lens-casing closure by means of closure elements.

The casing 1 comprises integrated therein a plurality of cavities 9 in the base thereof 3, each of said cavities housing a photovoltaic receiver 2, which improves the stability of the receiver 2 in the module, in addition to facilitating assembly. According to a particular embodiment of the invention, the photovoltaic receivers 2 are fixed to the casing 1 by means of plastic tabs 18 providing firm and easy to assemble and disassemble fixing. The tabs 18 are depicted in FIG. 3.

The casing 1 further comprises a plurality of metal laminar elements 10 for interconnecting the photovoltaic receivers 2. According to a particular embodiment of the invention, the photovoltaic receivers 2 can be detached from the inner face of the base 3 of the casing 1, specifically the cavities 9 in which they are housed.

As can be seen in the figures, to establish the closure of the Fresnel concentrator lenses 7, according to a specific embodiment the lenses are supported on a perimetral flange 19 of the upper part of the casing 1 and close against the casing 1 by means of plastic closure elements 11 distributed along the perimetral flange 19 of the upper part of the casing 1, being detachable from the latter. This closure system can preferably comprise an upper gasket 12 which is arranged between the plurality of Fresnel concentrator lenses 7 and the casing 1, as can be seen in FIG. 4b.

According to an alternative embodiment of the closure system, the Fresnel concentrator lenses 7 close against the casing 1 by means of overmolding said Fresnel concentrator lenses 7 on the casing 1 when manufactured by injection. By means of this embodiment the array of Fresnel concentrator lenses 7 is integral to the casing 1 and is an element integrated therein, and therefore, unlike in the preceding embodiment, in this case the lenses 7 are not detachable for accessing the inside of the module.

According to a particular embodiment of the invention, the secondary optical elements 8 have an inverted truncated pyramid shape, with curved or straight lines, for the purpose of achieving optimal concentration of the sunlight on the photovoltaic cell 5, and are made from BK7 material (glass, borosilicate, with excellent optical qualities).

Figure 8A:
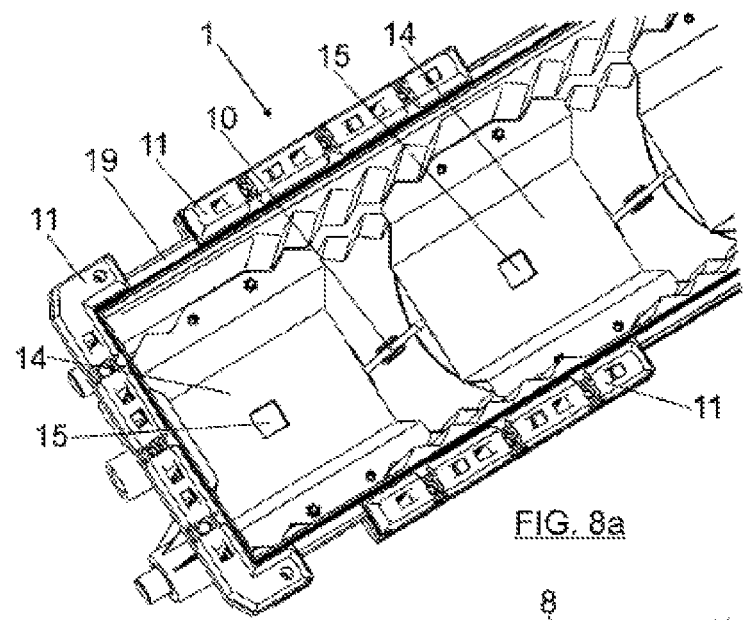
FIG. 8a shows a top view of the module of FIG. 1b, without the array of lenses in place, where protection means against defocusing can be seen.
Figure 8B:
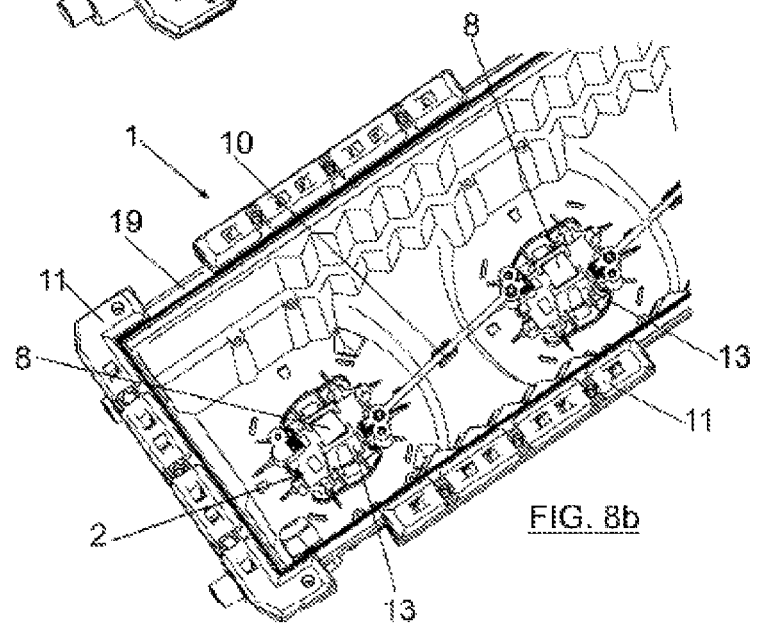
FIG. 8b shows the module of FIG. 8a, with protection means against defocusing removed in order to see the arrangement of the receivers, the laminar elements for interconnecting the receivers, and the plastic fastening parts of the secondary optical elements.

Preferably, and as observed in FIGS. 8b and 10b, the casing 1 comprises integrated plastic fastening parts 13 for fastening these secondary optical elements 8, providing greater stability and efficiency to the module.

FIG. 8a shows a particular embodiment of the invention, which has protection means against defocusing. These protection means against defocusing are formed by a protection plate 14 for the casing 1 for each of the photovoltaic receivers 2, which is arranged between the Fresnel concentrator lens 7 and said photovoltaic receiver 2. The protection plate 14 has an opening 15, through which the concentrated sunlight only reaches the secondary optical element 8, preventing damage to the casing 1.

Figure 2:
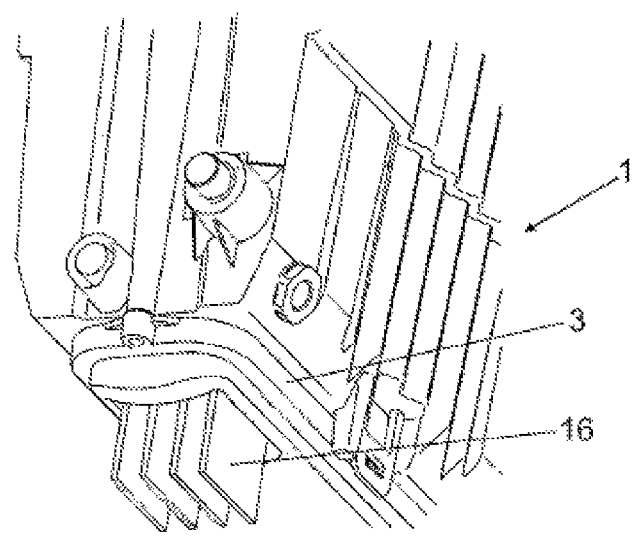
FIG. 2 shows the lower part of the module of FIG. 1a where the lower cover and sinks can be observed.
Figure 7:
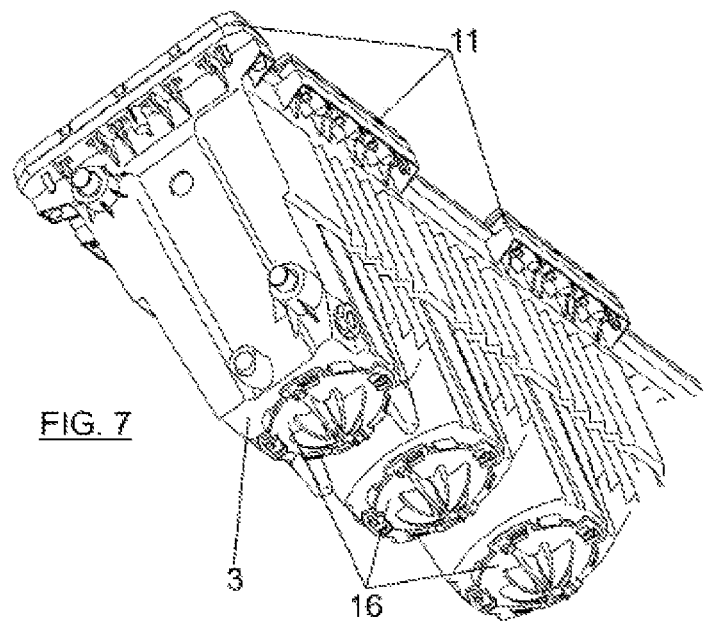
FIG. 7 shows a rear view of the module of FIG. 1b.

To prevent excessive heating, the solar module has heat sinks 16 to outwardly eliminate the heat given off by the photovoltaic receivers 2. According to a particular embodiment of the invention, these heat sinks 16 are arranged on the outer face of the base 3 of the casing 1, each in correspondence with a photovoltaic receiver 2, as can be seen in FIG. 2. According to a particular embodiment, which can be seen in FIGS. 7b and 9, these sinks 16 are detachable and additionally act as an element for opening and closing the casing 1 at the base thereof 3.

According to another particular embodiment of the invention, the heat sinks 16 of the solar module are all integrated in a single detachable lower cover 17 acting as an element for opening and closing the casing 1 at the base thereof 3.

The process for manufacturing the casing 1 is by injection-molding of special plastic (PET additionally reinforced with glass fiber or a similar polymer material) with manufacturing equipment similar to that use in other types of industries, such as the automotive or electronic industries. The casing 1 is manufactured with an L-shaped perimetral flange 19 on which the array of Fresnel concentrator lenses 7 will subsequently be supported, in the base 3 the casing 1 has housings or cavities 9 for the photovoltaic receivers 2 such that the subsequent placement thereof will be done in a simple and precise manner, and on the sides it comprises two wall bushing cavities for the positive cable and for the negative cable for connection with the outer cables of the module, as well as a decompression valve.

The process of assembling the solar module according to a particular embodiment comprises the following steps:

Manually or automatically inserting in the housing or cavity 9 indicated in the base 3 of the casing 1 the previously assembled photovoltaic receivers 2, comprising the ceramic or metal alloy surface 4, the photovoltaic cell 5, the protection diode 6 and the connectors, by means of a component with heat transfer properties.

This operation is performed the same number of times as there are Fresnel concentrator lenses 7 in the array of lenses.

Placing the lower cover with sinks 16, or placing all the sinks 16 individually.

Placing the gasket 12 in the outer perimetral flange 19. This operation is not necessary if the array of Fresnel concentrator lenses 7 is overmolded on the casing 1.

Placing the array of Fresnel concentrator lenses 7 on the L-shaped perimetral flange 19. This operation is not necessary either if the array of Fresnel concentrator lenses 7 is overmolded on the casing 1.

Closing by means of the closure part. This is also not necessary for the case of overmolding.

Screwing the side gripping parts to the solar tracker. This is also not necessary for the case of overmolding.

Finally, the module is characterized by means of a solar simulator to determine the power thereof, to establish its I-V curve and to classify the module according to these results.

As can be observed, one of the most significant advantages of this invention is the extraordinary simplicity of the process of assembling the module. The casing 1 itself has a significant functional integration including interconnecting the photovoltaic receivers 2 by means of conductive metal laminar elements 10, fastening part 13 for the secondary optical elements 8, contact and wiring for external connection (positive and negative), protection element against defocusing, overmolded fastening and rotation shafts, relief valve, option of a cavity for a dehumidification system, and integrated sinks Having clearly described the invention, it is hereby stated that the particular embodiments described above are susceptible to modifications in detail provided they do not alter the fundamental principle and essence of the invention.

The invention claimed is:

1. A high-concentration photovoltaic solar module, comprising:
a plastic casing having an upper part including sidewalls, and a base, the base having a top surface; wherein the sidewalls of the upper part and the top surface of the base define an upper cavity;
a plurality of lower cavities extending below the top surface of the base to the upper cavity of the casing, forming a row of lower cavities, the casing comprising therein:
a plurality of photovoltaic receivers, each of the plurality of lower cavities having arranged inside one of the photovoltaic receivers, the photovoltaic receivers being electrically interconnected with one another, each of the photovoltaic receivers comprising:
a receiver surface on which there is arranged at least one photovoltaic cell,
a protection diode, and
respective connectors of the photovoltaic receiver;
an array of Fresnel concentrator lenses mounted to the upper part of the casing in a plane parallel to a plane of the photovoltaic receivers and forming a sealed structure, each of the Fresnel concentrator lenses being arranged on one of said photovoltaic receivers;
a plurality of secondary optical elements, each arranged on the photovoltaic cell of each photovoltaic receiver and retained by integrated fastening elements of the casing;
a plurality of metal laminar elements integrated in the casing adapted to interconnect the photovoltaic receivers.

2. The high-concentration photovoltaic solar module according to claim 1, wherein the plastic casing comprises glass fiber-reinforced PET plastic.

3. The high-concentration photovoltaic solar module according to claim 1, wherein the Fresnel concentrator lenses are supported on a perimetral flange of the upper part of the casing.

4. The high-concentration photovoltaic solar module according to claim 1, wherein the array of Fresnel concentrator lenses closes against the casing by plastic closure elements detachably distributed along the perimetral flange of the upper part of the casing.

5. The high-concentration photovoltaic solar module according to claim 1, wherein an upper gasket is arranged between the plurality of Fresnel concentrator lenses and the casing.

6. The high-concentration photovoltaic solar module, according to claim 1, wherein the Fresnel concentrator lenses are overmolded on the casing.

7. The high-concentration photovoltaic solar module according to claim 1, wherein the secondary optical elements have an inverted truncated pyramid shape.

8. The high-concentration photovoltaic solar module according to claim 1, wherein the secondary optical elements are made from BK7 material.

9. The high-concentration photovoltaic solar module according to claim 1, wherein the receiver surface of the photovoltaic receiver is made from a material selected from ceramic and metal alloy.

10. The high-concentration photovoltaic solar module according to claim 1, further comprising a protector against defocusing comprising a protection plate for the casing for each of the photovoltaic receivers, arranged between the Fresnel concentrator lens and said photovoltaic receiver, defining an opening configured to limit concentrated sunlight passing through the opening to only reach the secondary optical element.

11. The high-concentration photovoltaic solar module according to claim 1, further comprising a plurality of heat sinks arranged on an outer face of the base of the casing, each of the heat sinks being detachable and aligned with an associated photovoltaic receiver and configured to dissipate heat outwardly given off by the associated photovoltaic receiver, the heat sinks being configured as a closure element for the casing at the base.

12. The high-concentration photovoltaic solar module, according to claim 1, further comprising a plurality of heat sinks which dissipate the heat given off by each photovoltaic receiver outwardly, each of the heat sinks being in correspondence with a photovoltaic receiver, and the heat sinks are all integrated on an outer face of a detachable lower cover configured as a closure element of the casing at the base.

13. The high-concentration photovoltaic solar module according to claim 1, wherein the photovoltaic receivers are fixed to the casing by plastic tabs.

14. A high-concentration photovoltaic solar module, comprising:
- a plastic casing having an upper part including sidewalls, and a base, the base having a top surface; wherein the sidewalls of the upper part and the top surface of the base define an upper cavity;
- a plurality of lower cavities extending below the top surface of the base to the upper cavity of the casing, forming a row of lower cavities, the casing comprising therein:
- a plurality of photovoltaic receivers, each of the plurality of lower cavities having arranged inside one of the photovoltaic receivers, the photovoltaic receivers being electrically interconnected with one another, each of the photovoltaic receivers comprising:
  - a receiver surface on which there is arranged at least one photovoltaic cell,
  - a protection diode, and
  - respective connectors of the photovoltaic receiver;
- an array of Fresnel concentrator lenses mounted to the upper part of the casing in a plane parallel to a plane of the photovoltaic receivers and forming a sealed structure each of the Fresnel concentrator lenses being arranged on one of said photovoltaic receivers;
- a plurality of secondary optical elements, each arranged on the photovoltaic cell of each photovoltaic receiver;
- a plurality of metal laminar elements integrated in the casing adapted to interconnect the photovoltaic receivers;
- wherein the photovoltaic receivers are detachable from an inner face of the base of the casing.

15. The high-concentration photovoltaic solar module according to claim 14, wherein the plurality of photovoltaic receivers are mounted on a single detachable cover mounted to the base of the casing.

16. The high-concentration photovoltaic solar module according to claim 15, wherein the single detachable cover comprises a plurality of sets of heat sinks extending outward from the casing when mounted, each of the sets of heat sinks being aligned with an associated photovoltaic receiver.

17. The high-concentration photovoltaic solar module according to claim 14, comprising a plurality of covers arranged on an outer face of the base of the casing, each of the covers being detachable and aligned with an associated photovoltaic receiver, each of the covers including heat sinks extending away from the casing configured to dissipate heat outwardly given off by the associated photovoltaic receiver.

18. The high-concentration photovoltaic solar module according to claim 17, the covers form slots configured to engage retaining elements on the casing.

* * * * *